United States Patent [19]

Takashima et al.

[11] Patent Number: 5,648,681
[45] Date of Patent: Jul. 15, 1997

[54] SEMICONDUCTOR DEVICE HAVING A SUPPORTING LEAD TO SUPPORT A BYPASS LEAD PORTION

[75] Inventors: Akira Takashima, Kawasaki; Hiroshi Yoshimura, Kagoshima; Kosuke Otokita, Kawasaki, all of Japan

[73] Assignee: Fujitsu Limited, Kawasaki, Japan

[21] Appl. No.: 588,911

[22] Filed: Jan. 19, 1996

[30] Foreign Application Priority Data

Jul. 25, 1995 [JP] Japan .................... 7-189568

[51] Int. Cl.$^6$ .................................... H01L 23/495
[52] U.S. Cl. .................................... 257/666; 257/674
[58] Field of Search .................... 257/666, 669, 257/674, 773, 776

[56] References Cited

U.S. PATENT DOCUMENTS 5,276,352  1/1994  Komenaka et al. .............. 257/666
5,424,576  6/1995  Djennas et al. .................. 257/666
5,457,341  10/1995  West .............................. 257/666

Primary Examiner—Mahshid D. Saadat
Assistant Examiner—S. V. Clark
Attorney, Agent, or Firm—Armstrong, Westerman, Hattori, McLeland & Naughton

[57] ABSTRACT

A semiconductor device includes a semiconductor chip having electrode pads on the semiconductor chip, the electrode pads including a predetermined electrode. A plurality of leads are electrically connected to the electrode pads on the semiconductor chip, the leads including a predetermined lead electrically connected to the predetermined electrode. A resin package encloses the semiconductor chip and partially encloses the leads. A bypass lead portion electrically connects one of the leads, not adjacent to the predetermined electrode, to a location adjacent to the predetermined electrode, the bypass lead portion being enclosed in the resin package. A supporting lead supports the bypass lead portion such that the supporting lead prevents a deformation of the bypass lead portion, the supporting lead being enclosed in the resin package.

9 Claims, 13 Drawing Sheets

SEMICONDUCTOR DEVICE HAVING A SUPPORTING LEAD TO SUPPORT A BYPASS LEAD PORTION

BACKGROUND OF THE INVENTION (1) Field of the Invention

The present invention relates to a semiconductor device in which a bypass lead portion connecting a non-adjacent lead and an electrode is included to provide a flexibility of wiring of leads and electrodes. The present invention relates to a method of producing the semiconductor device by using a lead frame to provide the flexibility of wiring of leads and electrodes. The present invention relates to a semiconductor device unit in which two or more semiconductor devices which are the same as the above semiconductor device are stacked to increase a packaging density.

(2) Description of the Related Art

There are demands for small-size, high-speed electronic units in recent years, and, in particular, semiconductor devices having smaller sizes and higher speeds are required. To provide small and high-speed semiconductor devices, it is desirable to increase the packaging density related to the semiconductor devices. As an attempt to increase the packaging density, a semiconductor device unit in which a plurality of semiconductor devices are located one above another is under development.

The number of electrode pads which can be provided on a single semiconductor chip is limited, and it is difficult to perform the wiring of leads and electrode pads on the semiconductor chip by using a known wiring technique, in order to realize a desired level of the packaging density.

It is desirable to provide a semiconductor device which allows a flexible wiring of leads and electrodes on the semiconductor chip. Also, it is desirable to increase the packaging density related to the semiconductor devices and provide a small-size electronic unit in which the semiconductor devices are included.

FIG. 1 shows a wire-bonded portion of a semiconductor device 1. In this semiconductor device 1, a conceivable lead connecting portion for connecting a lead and an electrode which are not adjacent is included.

Referring to FIG. 1, a semiconductor chip 2 is bonded to a die stage 3 in the semiconductor device 1. A plurality of electrode pads 4a through 4e are provided on the semiconductor chip 2. A plurality of leads 6 are electrically connected to the electrode pads 4a through 4e by wires 5.

The leads 6 include respective outer lead portions and respective inner lead portions 6a through 6e. The outer lead portions serve as external terminals of the semiconductor chip 2. The inner lead portions 6a–6e are electrically connected to the electrode pads 4a–4e on the semiconductor chip 2 via the wires 5. For the sake of simplicity, only the inner lead portions 6a–6e of the leads 6 on the semiconductor chip 2 are shown in FIG. 1.

The semiconductor device 1 includes a resin package 7 enclosing the semiconductor chip 2 and the wires 5, and partially enclosing the leads 6. These elements of the semiconductor device 1 are protected from the outside by the resin package 7.

In the semiconductor device 1, shown in FIG. 1, it is necessary to provide a lead connecting portion 8 in order to connect the non-adjacent lead 6b and electrode pad 4e. The lead connecting portion 8 includes a crossing piece extending along a side edge of the semiconductor chip 2, and includes an edge 8a adjacent to the electrode pad 4e on the semiconductor chip 2. The edge 8a of the lead connecting portion 8 is electrically connected to the electrode pad 4e by the wire 5.

The lead connecting portion 8 allows an electrical connection of the inner lead portion 6b and the electrode pad 4e which are not adjacent. Thus, the use of the lead connecting portion 8 provides a flexibility of the wiring of the leads and the electrodes for the semiconductor device 1.

It is conceivable to produce a semiconductor device unit in which various semiconductor devices of the type such as the above semiconductor device 1 are stacked one over another, in order to increase the packaging density related to the semiconductor devices. In this semiconductor device unit, each semiconductor chip of the semiconductor devices must have a chip-select electrode in order to select that semiconductor chip to be enabled or disabled. The chip-select electrode allows the complete semiconductor chip to be enabled or disabled according to a chip-select signal on the chip-select electrode.

In the semiconductor device 1, shown in FIG. 1, the electrode pad 4e is the above-mentioned chip-select electrode. This chip-select electrode is electrically connected to a predetermined lead (which is, for example, the lead 6b in FIG. 1) among the leads 6 of the semiconductor device 1.

There are several cases in which the chip-select lead and the chip-select electrode which are not adjacent must be connected to each other, because of the circuit layout of the semiconductor device unit. In such cases, the use of the lead connecting portion 8 allows the non-adjacent lead 6b and electrode 4e to be electrically connected to each other.

However, in the above semiconductor device 1, no supporting element which supports the lead connecting portion 8 is provided. When a relatively long lead connecting portion 8 must be included in the semiconductor device 1, a mechanical strength of the lead connecting portion 8 is inadequate and the lead connecting portion 8 tends to be deformed during the manufacture. For example, when the semiconductor device 1 is molded with the resin package 7 by a resin material, the lead connecting portion 8 may be deformed by the resin material during the molding process.

If the above lead connecting portion 8 is bent by the resin material, the lead connecting portion 8 may interfere with or damage the other leads 6c–6e or the wires 5 connecting the leads 6c–6e and the electrode pads 4c–4e. Thus, the reliability of the above semiconductor device 1 after the manufacture is relatively low.

SUMMARY OF THE INVENTION

An object of the present invention is to provide an improved semiconductor device in which the above-described problems are eliminated.

Another object of the present invention is to provide a semiconductor device which includes a bypass lead portion providing a flexibility of wiring of leads and electrodes for the semiconductor device, and includes a supporting lead reliably supporting the bypass lead portion to prevent a deformation of the bypass lead portion during the manufacture and increase the reliability of the semiconductor device.

Still another object of the present invention is to provide a method of producing the above-mentioned semiconductor device by using a lead frame in which a flexibility of wiring of leads and electrodes for the semiconductor device is provided, and a deformation of the bypass lead portion is prevented to increase the reliability of the semiconductor device.

A further object of the present invention is to provide a semiconductor device unit in which two or more semiconductor devices which are the same as the above-mentioned semiconductor device are stacked one over another in order to increase the packaging density of the semiconductor device unit while the reliability of the semiconductor devices is maintained.

The above-mentioned objects of the present invention are achieved by a semiconductor device which includes a semiconductor chip having electrode pads on the semiconductor chip, the electrode pads including a predetermined electrode; a plurality of leads having inner lead portions and outer lead portions, the inner lead portions electrically connected to the electrode pads, and the outer lead portions serving as external terminals of the semiconductor chip, the leads including a predetermined lead electrically connected to the predetermined electrode; a resin package which encloses the semiconductor chip and partially encloses the leads; a bypass lead portion which electrically connects one of the leads, not adjacent to the predetermined electrode, to a location adjacent to the predetermined electrode, the bypass lead portion being enclosed in the resin package; and at least one supporting lead which supports the bypass lead portion such that the supporting lead prevents a deformation of the bypass lead portion, the supporting lead being enclosed in the resin package.

The semiconductor device of the present invention includes the bypass lead portion, which provides a flexibility of the wiring of the leads and the electrodes for the semiconductor device. The semiconductor device of the present invention further includes the supporting lead which reliably supports the bypass lead portion, and it is possible to increase the mechanical strength of the bypass lead portion and prevent the deformation of the bypass lead portion during the manufacture.

BRIEF DESCRIPTION OF THE DRAWINGS

The above and other objects, features and advantages of the present invention will become more apparent from the following detailed description when read in conjunction with the accompanying drawings in which.

DESCRIPTION OF THE PREFERRED EMBODIMENTS

A description will now be given of the preferred embodiments of the present invention with reference to the accompanying drawings.

Figure 1:
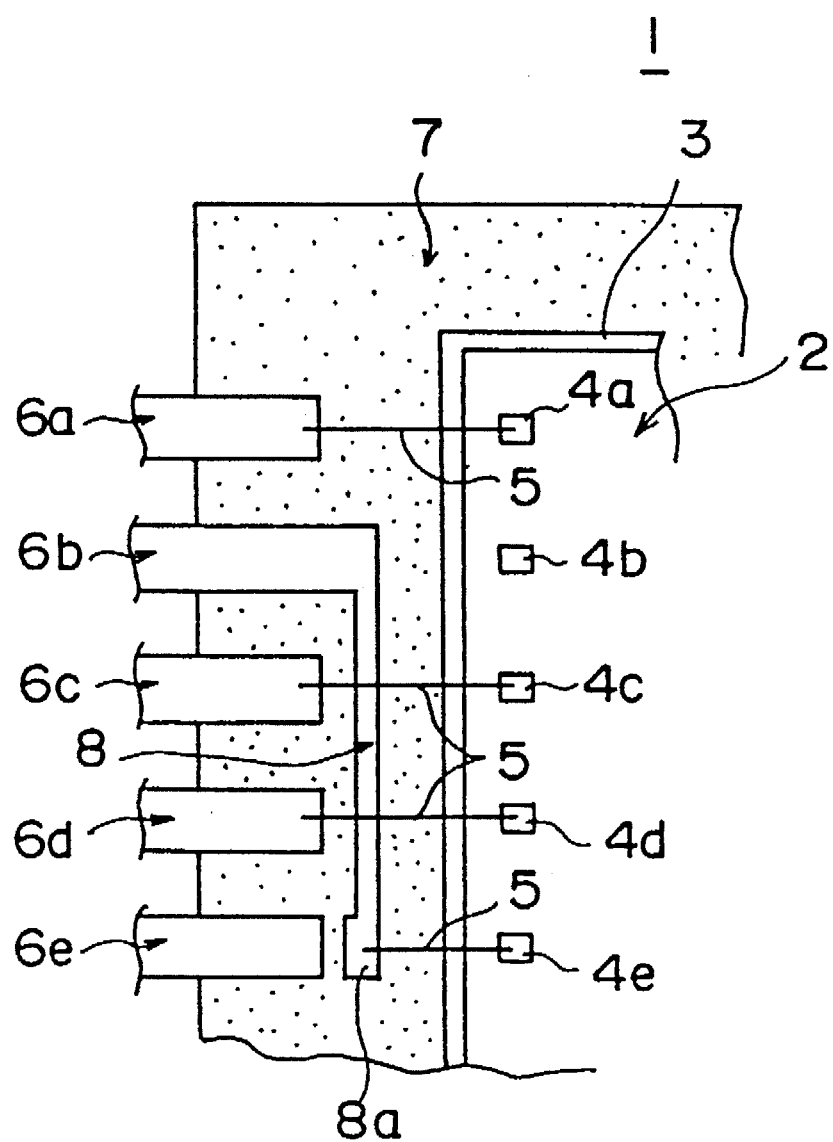
FIG. 1 is a diagram of a wire-bonded portion of a semiconductor device in which a conceivable lead connecting portion connecting a lead and an electrode is included.
Figure 2:
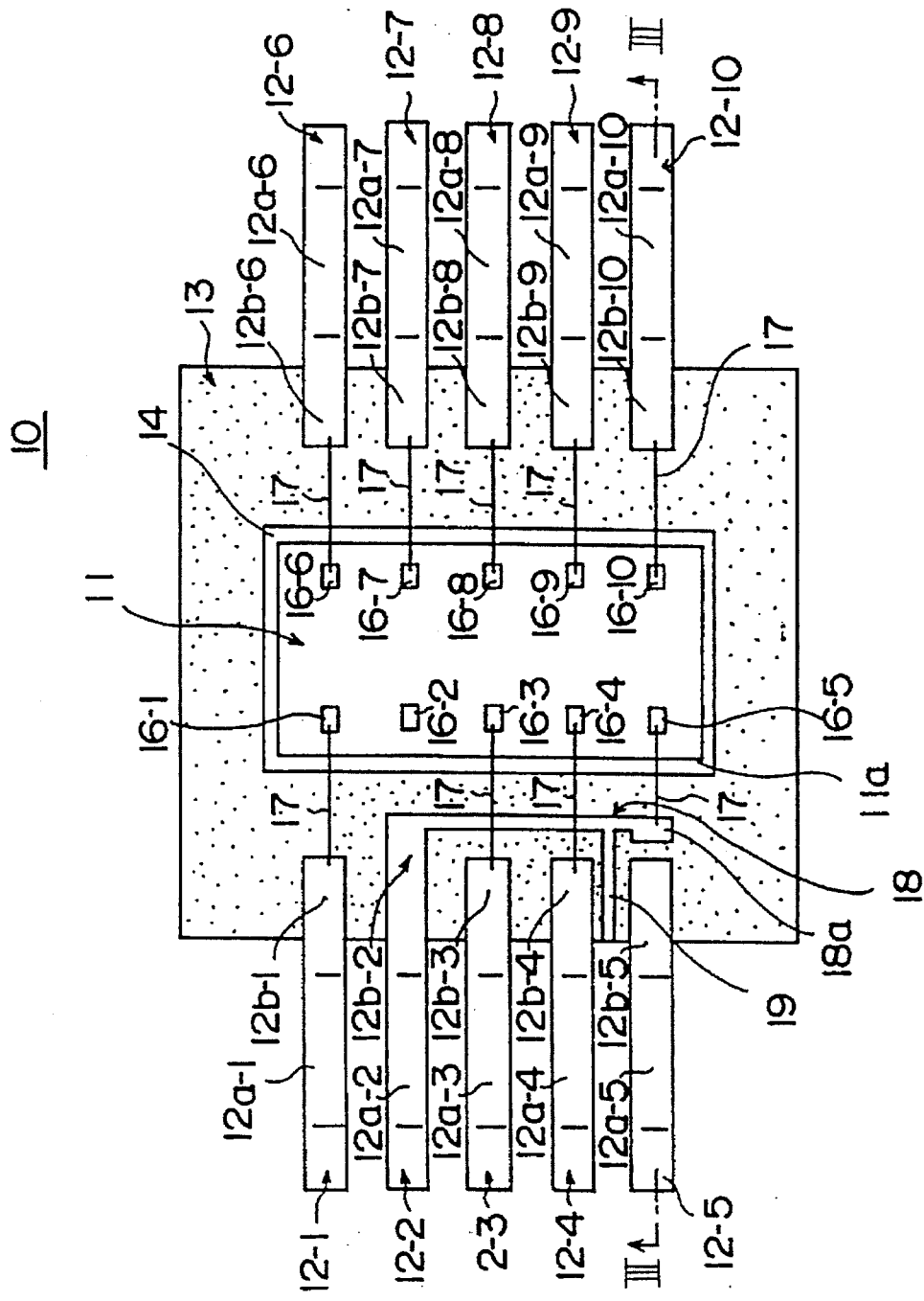
FIG. 2 is a diagram of a semiconductor device in one embodiment of the present invention.
Figure 3:
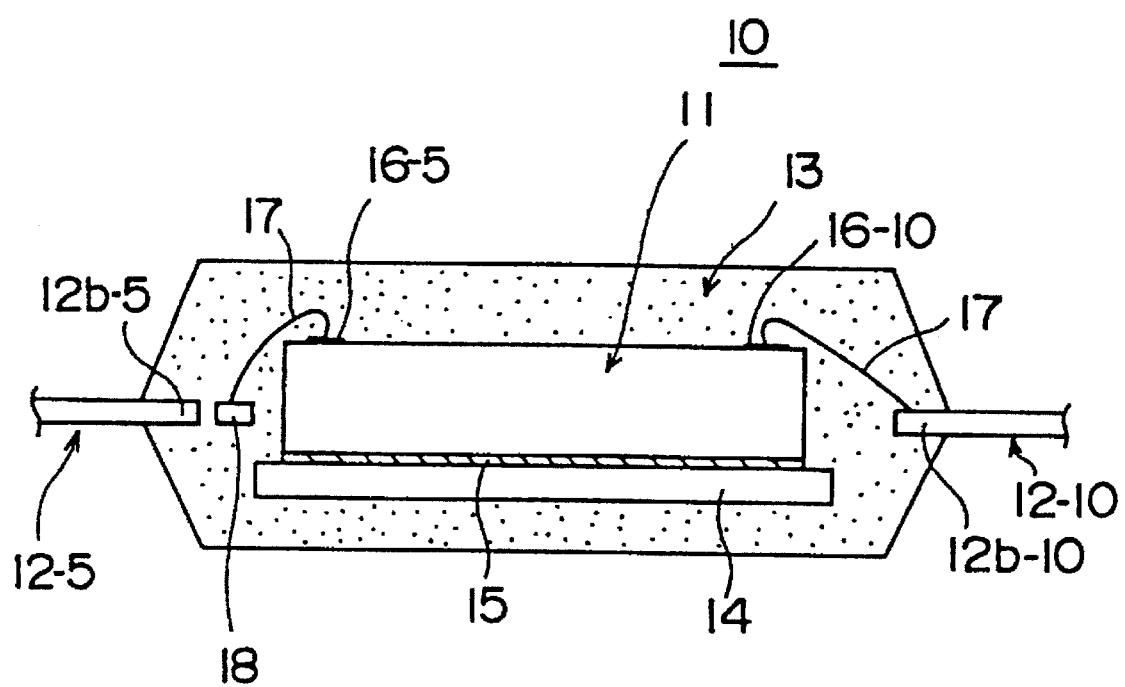
FIG. 3 is a cross-sectional view of the semiconductor device taken along a line III—III shown in FIG. 2.

FIGS.2 and 3 show a semiconductor device 10 in one embodiment of the present invention.

Referring to FIGS.2 and 3, the semiconductor device 10 generally has a semiconductor chip 11, a plurality of leads 12-1 through 12-10, and a resin package 13. The semiconductor chip 11 is bonded to a die stage 14 by a die bonding material 15. A plurality of electrode pads 16-1 through 16-10 are provided in two rows on the top of the semiconductor chip 11.

The semiconductor chip 11 in the present embodiment is a memory chip. The electrode pads 16-1 through 16-10 on the semiconductor chip 11 include a chip-select electrode which is freely selected from among the electrode pads 16-1 through 16-10. In the present embodiment, the electrode pad 16-5 is the chip-select electrode. The chip-select electrode 16-5 allows the complete semiconductor chip to be enabled or disabled according to a chip-select signal on the chip-select electrode. The other electrode pads 16-1 through 16-4 and 16-6 through 16-10 are formed as signal electrodes, power-supplying electrodes, or grounding electrodes in the semiconductor chip 11.

The leads 12-1 through 12-10 in the present embodiment are made of a copper alloy or an iron alloy (for example, "42 alloy"). The leads 12-1 through 12-10 have respective outer lead portions 12a-1 through 12a-10 and respective inner lead portions 12b-1 through 12b-10. The outer lead portions 12a-1 through 12a-10 serve as external terminals of the semiconductor device 10 to be electrically connected with an external device. The inner lead portions 12b-1 through 12b-10 are electrically connected with the electrode pads 16-1 through 16-10 on the semiconductor chip 11 by wires 17.

In the present embodiment, the lead 12-2 among the leads 12-1 through 12-10 is a chip-select lead on which the chip-select signal is present. A bypass lead portion 18 extends from the chip-select lead 12-2 to a location adjacent to the chip-select electrode 16-5. The bypass lead portion 18 is connected to the chip-select electrode 16-5 by the wire 17. Thus, the chip-select signal from the chip-select lead 12-2 is supplied to the chip-select electrode 16-5 through the bypass lead portion 18. The other leads 12-1 and 12-3 through 12-10 are used as signal leads, power-supplying leads or grounding leads for the semiconductor chip 11.

The resin package 13 in the present embodiment is made of an epoxy resin. The semiconductor chip 11, the wires 17 and portions of the leads 12-1 through 12-10 are enclosed in the resin package 13. The resin package 13 serves to protect the integrated circuit on the semiconductor chip 11 from the outside of the semiconductor chip 11.

As shown in FIG. 2, the bypass lead portion 18 extends from the inner lead portion 12b-2 of the lead 12-2 to an end 18a, located adjacent to the electrode 16-5, along a side edge of the semiconductor chip 11. The bypass lead portion 18 is substantially parallel to the side edge of the semiconductor chip 11. The end 18a of the bypass lead portion 18 is electrically connected to the chip-select electrode 16-5 by the wire 17. The bypass lead portion 18 is formed with a width smaller than a width of the lead 12-2, and only the end 18a has an increased width which is greater than the width of the other area of the bypass lead portion 18. The increased width of the end 18a serves to facilitate the connection between the end 18a and the chip-select electrode 16-5 by the wire 17.

The above-described bypass lead portion 18 makes it possible to connect the chip-select lead 12-2 and the chip-select electrode 16-5 which are not adjacent, and the bypass lead portion 18 is completely enclosed in the resin package 13. The chip-select lead is freely selected from among the leads 12-1 through 12-5, and the chip-select electrode is freely selected from among the electrode pads 16-1 through 16-5. Therefore, the bypass lead portion 18 provides a flexibility of the wiring of the leads and the electrodes for the semiconductor device 10.

The above-described bypass lead portion 18 extends along the side edge of the semiconductor chip 11 and is located at a height which is the same as a height of the leads 12-1 through 12-5 in the semiconductor device 10. More specifically, the bypass lead portion 18 is located below the wires 17 which connect the leads 12-3 and 12-4 and the electrode pads 16-3 and 16-4, respectively. Thus, the bypass lead portion 18 does not interfere with the wires 17 between the leads 12-3 and 12-4 and the electrode pads 16-3 and 16-4 during the manufacture. In addition, the use of the bypass lead portion 18 in the semiconductor device 10 of the present invention serves to provide a semiconductor device having a smaller size.

In the present embodiment, the semiconductor device 10 includes a supporting lead 19 which supports the bypass lead portion 18. The supporting lead 19 extends in a direction perpendicular to the bypass lead portion 18 and is enclosed in the resin package 13.

Figure 4:
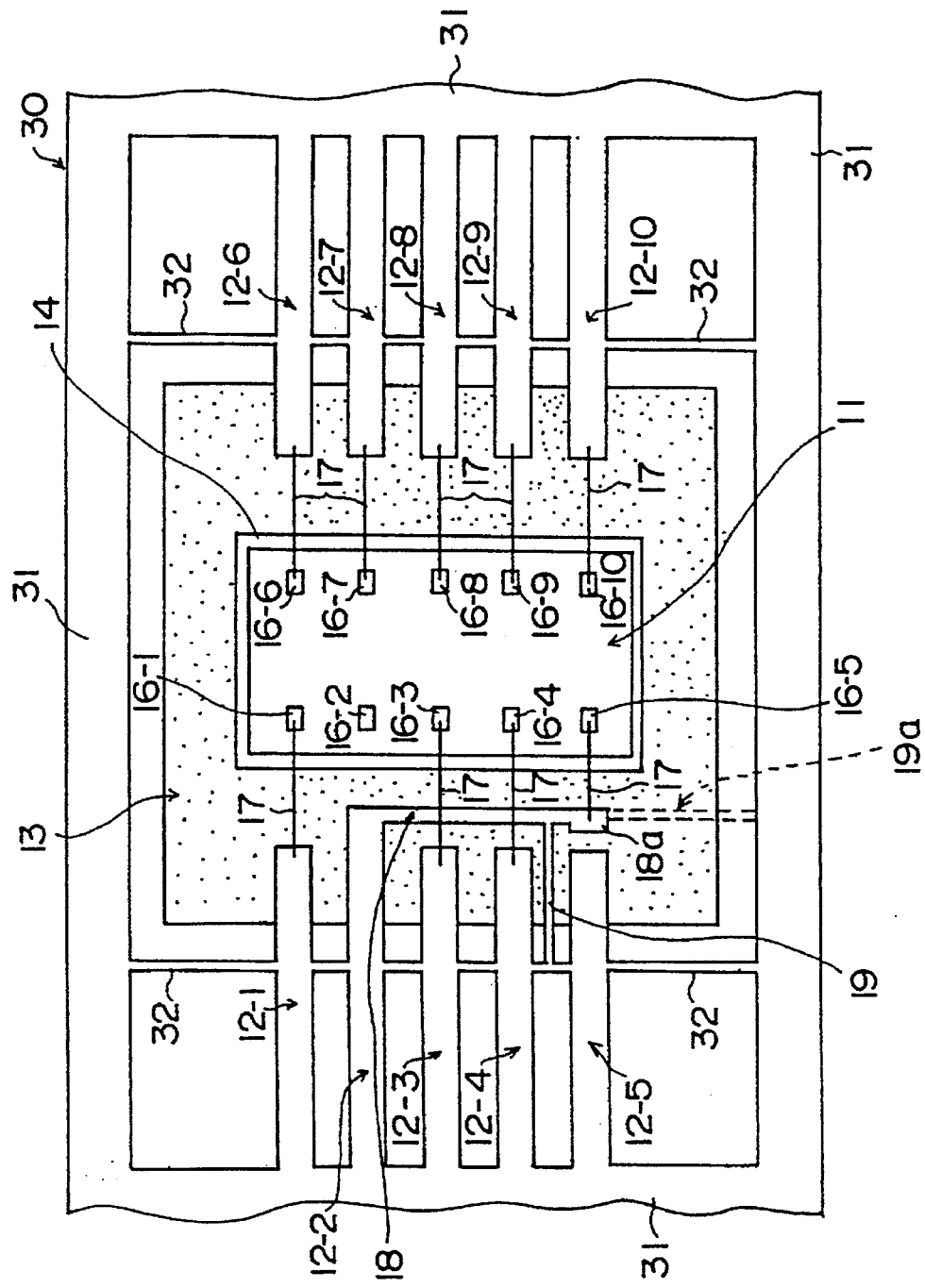
FIG. 4 is a diagram of a lead frame for use with the semiconductor device in FIG. 2.

FIG. 4 shows a lead frame 30 for use with the semiconductor device 10 when a resin molding process is performed to enclose the semiconductor chip 11 in the resin package 13.

Referring to FIG. 4, the lead frame 30 has a frame (or cradle) 31 which holds the leads 12-1 through 12-10 in the semiconductor device 10. The lead frame 30 includes a set of tie bars 32 which are connected crosswise to the leads 12-1 through 12-10. More specifically, one of the tie bars 32 crosses the leads 12-1 through 12-5 and the other tie bar 32 crosses the leads 12-6 through 12-10. The tie bars 32 serve to keep a pitch (or a distance between two adjacent leads) of the leads 12-1 through 12-10 at a constant distance during the resin molding process. The tie bars 32 serve to prevent the resin material of the resin package 13 from being forced out of the semiconductor device 10 during the resin molding process.

The supporting lead 19 is held by the frame 31 and provided between one of the tie bars 32 and the bypass lead portion 18. The supporting lead 19 connects the tie bar 32 and the bypass lead portion 18. More specifically, one end of the supporting lead 19 is attached to the bypass lead portion 18 in the semiconductor device 10, and the other end of the supporting lead 19 is attached to the tie bar 32 in the lead frame 30.

The location at which the supporting lead 19 is disposed is selected so as to appropriately increase the mechanical strength of the bypass lead portion 18. For example, the preferred location of the supporting lead 19 is a location between the leads 12-4 and 12-5 in the vicinity of the end 18a of the supporting lead 19. In addition, to avoid the interference between the supporting lead 19 and the leads 12-4 and 12-5, the supporting lead 19 is interposed between the leads 12-4 and 12-5 to extend in the middle of the leads 12-4 and 12-5.

It is possible that the supporting lead 19 increase the mechanical strength of the bypass lead portion 18 even when the bypass lead portion 18 which is relatively long must be used. Also, the supporting lead 19 serves to prevent the bypass lead portion 19 from being deformed by the resin material during the resin molding process.

Generally, the lead frame 30 includes the tie bars 32 to keep the pitch of the leads 12-1 through 12-10 at a constant distance and prevent the resin material from being forced out of the semiconductor device 10 during the resin molding process. Therefore, the tie bars 32 can easily be used as the element which holds the supporting lead 19. Accordingly, the supporting lead 19 can easily be provided in the lead frame 30.

After the resin molding process is performed, a frame removing process and a lead forming process are performed with the semiconductor device 10 and the lead frame 30. When the resin molding process is performed, the semiconductor device 10 is enclosed in the resin package 13, and the lead frame 30 still remains with the semiconductor device 10.

The frame removing process is performed to remove the frame 31 and the tie bars 32 from the semiconductor device 10. In particular, after the resin molding process is performed, the supporting lead 19 of the semiconductor device 10 is cut from the lead frame 30 at a position on the resin package 13.

The lead forming process is performed to finally form the leads 12-1 through 12-10 in the semiconductor device 10.

A part of the supporting lead 19 projecting from the resin package 13 is removed from the semiconductor device 10 when the above frame removing process is performed. During the lead forming process, the outer lead portions 12a-1 through 12a-10 are bent downward from the other portions of the leads 12-1 through 12-10, and the edges of the outer lead portions 12a-1 through 12a-10 are further bent to extend in a horizontal direction.

In the above-described embodiment, the supporting lead 19 is interposed between the leads 12-4 and 12-5 to extend in the middle of the leads 12-4 and 12-5. However, in a case in which a semiconductor device including a greater number of leads is needed, the pitch of the leads in such a semiconductor device is not large enough to have the supporting lead 19 interposed between two adjacent leads of the leads.

In the above case, a modification of the supporting lead 19 may be made according to the present invention. Another supporting lead 19a may be provided in the semiconductor device 10 instead of the supporting lead 19. One end of the supporting lead 19a is attached to the frame 31 of the lead frame 30, and the other end of the supporting lead 19a is attached to the end 18a of the bypass lead portion 18, as indicated by a dotted line in FIG. 4.

In the above modification, a location of the supporting lead 19a being disposed and a width of the supporting lead 18a may be freely selected such that the supporting lead 19a can reliably support the bypass lead portion 18.

In the above-described embodiment, a single supporting lead 19 is provided in the semiconductor device 10. However, two or more supporting leads 19 may be provided to support the bypass lead portion 18 in the semiconductor device 10 of the present invention.

In the above-described embodiment, the lead 12-5, which is located adjacent to the chip-select electrode 16-5, is a non-used lead which is not connected to any of the electrode pads 16-1 through 16-10 in the semiconductor device 10.

Figure 5:
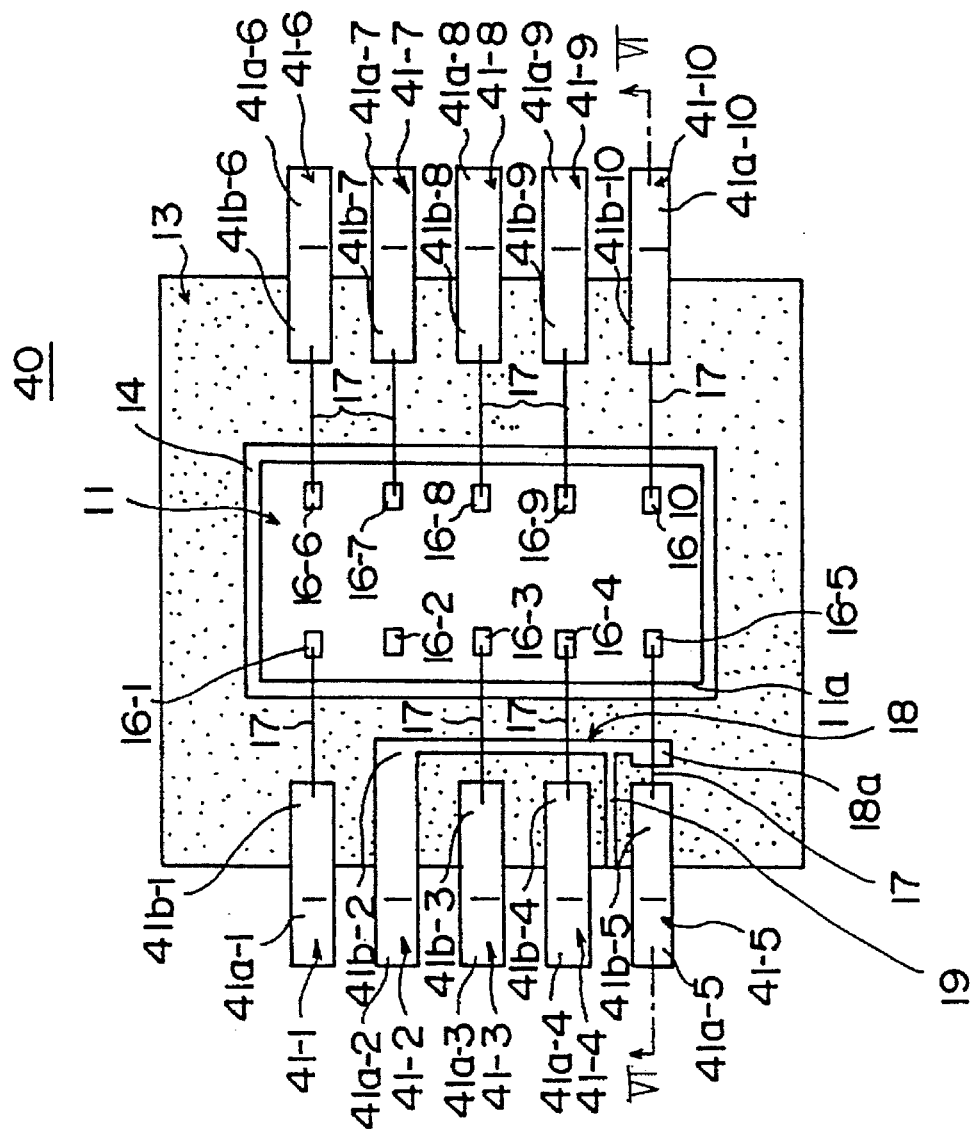
FIG. 5 is a diagram of a semiconductor device in another embodiment of the present invention.
Figure 6:
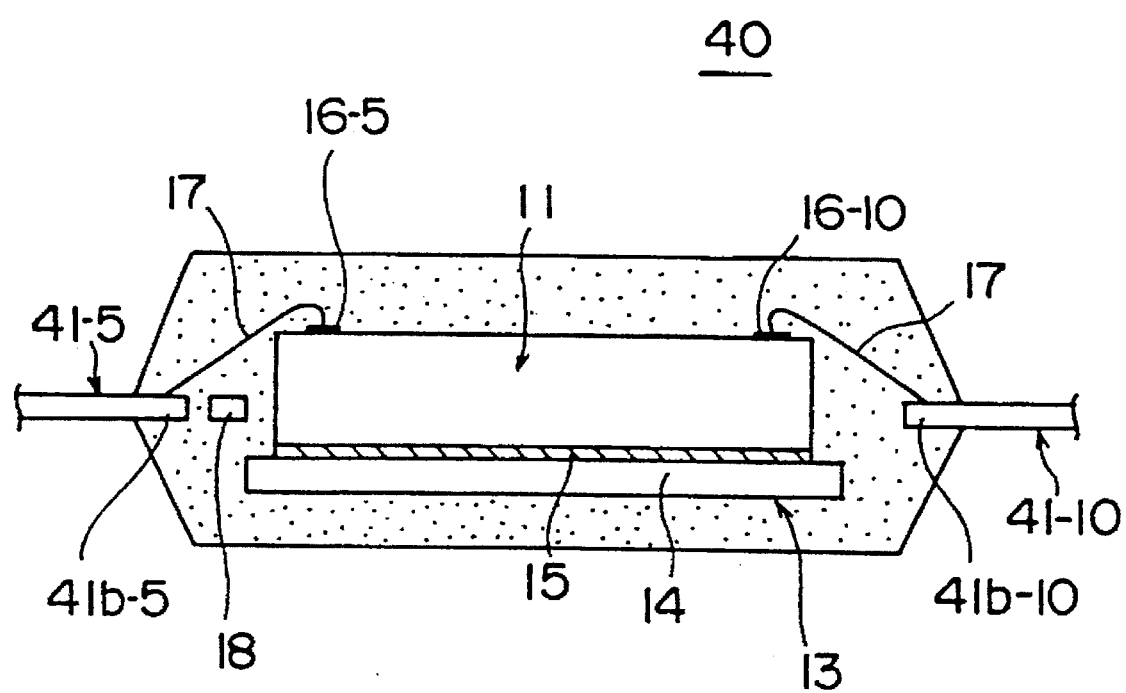
FIG. 6 is a cross-sectional view of the semiconductor device taken along a line VI—VI shown in FIG. 5.
Figure 7:
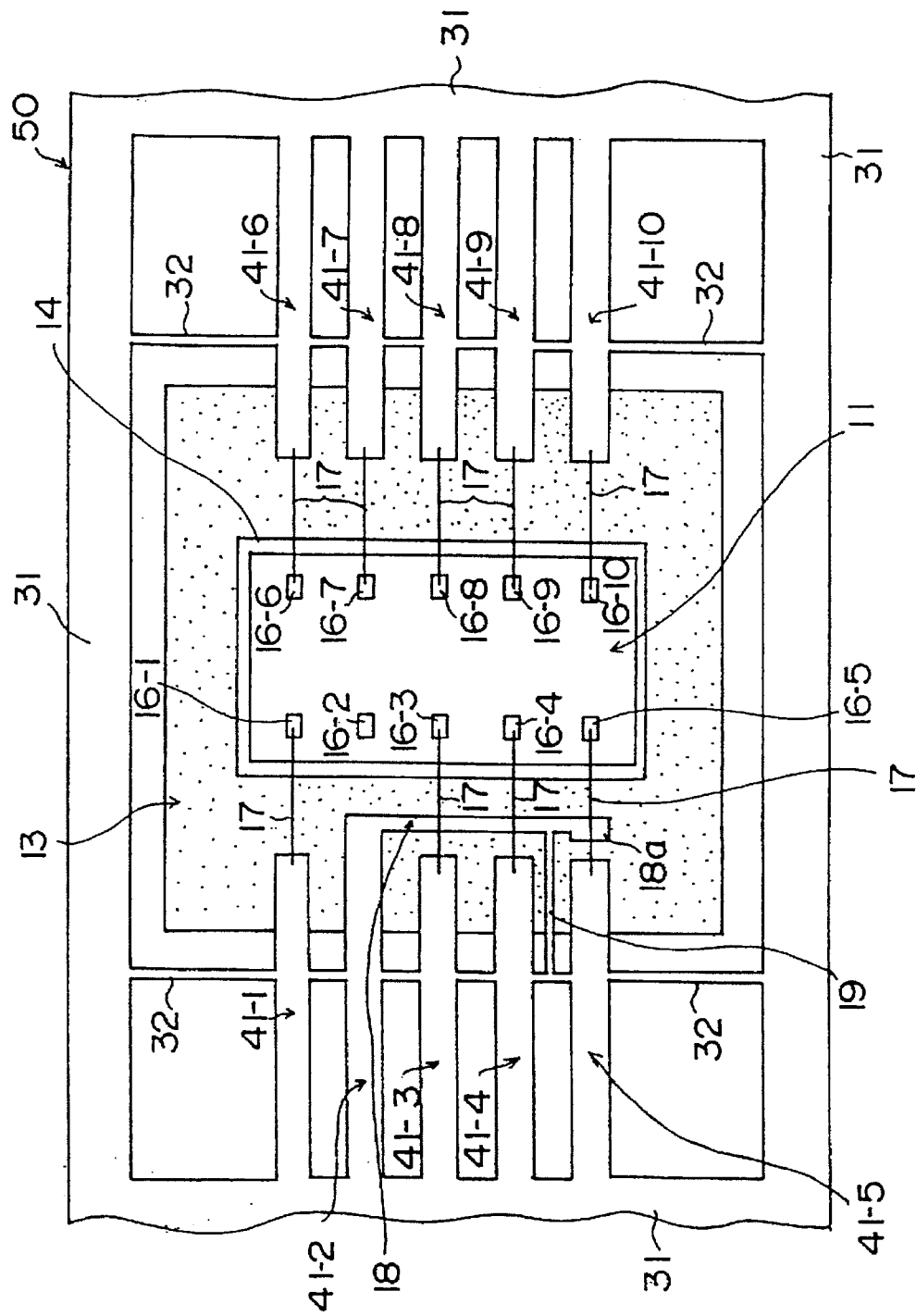
FIG. 7 is a diagram of a lead frame for use with the semiconductor device in FIG. 5.

FIGS. 5 and 6 show a semiconductor device 40 in another embodiment of the present invention. FIG. 7 shows a lead frame 50 for use with the semiconductor device 40 when the resin molding process is performed. In FIGS. 5, 6 and 7, the elements which are the same as the corresponding elements in FIGS. 2, 3 and 4 are designated by the same reference numerals, and a description thereof will be omitted.

Referring to FIGS. 5 and 6, the semiconductor device 40 generally has a plurality of leads 41-1 through 41-10, the semiconductor chip 11, the resin package 13, the die stage 14, the electrode pads 16-1 through 16-10, and the wires 17. In this semiconductor device 40, the lead 41-5 and the chip-select electrode 16-5 are electrically connected by the wire 17.

In the semiconductor device 40, the bypass lead portion 18 extends from the inner lead portion 41b-2 of the lead 41-2 to the end 18a, adjacent to the chip-select electrode 16-5, along the side edge of the semiconductor chip 11. The semiconductor device 40 includes the supporting lead 19 which supports the bypass lead portion 18. The bypass lead portion 18 and the supporting lead 19 are enclosed in the resin package 13.

In the present embodiment, shown in FIGS. 5 and 6, the lead 41-5 is the chip-select lead to be electrically connected to the chip-select electrode 16-5. The bypass lead portion 18 extends from the lead 41-2 to the end 18a adjacent to the chip-select electrode 16-5 along the side edge of the semiconductor chip 11. The bypass lead portion 18 is a non-used lead which is not connected to any of the electrode pads 16-1 through 16-5 on the semiconductor chip 11.

In the embodiment of FIGS. 5 and 6, the supporting lead 19 supports the bypass lead portion 18 at a location adjacent to the chip-select electrode 16-5, and serves to prevent the deformation of the bypass lead portion 18 during the resin molding process. Thus, the supporting lead 19 avoids the interference between the bypass lead portion 18 and the other leads 41-1 and 41-3 through 41-5. Also, it is possible to prevent the bypass lead portion 18 from being brought into contact with the wires 17 connecting the leads 41-3, 41-4 and 41-5 and the electrode pads 16-3, 16-4 and 16-5.

In the embodiment of FIGS. 5 and 6, the end 18a of the bypass lead portion 18 is disposed between the chip-select lead 41-5 and the chip-select electrode 16-5. However, the bypass lead portion 18 is, as shown in FIG. 6, located below the wire 17 which connects the chip-select lead 41-5 and the chip-select electrode 16-5. Therefore, the wire connection between the lead 41-5 and the electrode 16-5 is not influenced by the bypass lead portion 18.

A length of the wire 17 can be adjusted by controlling a wire bonding unit. The wire bonding unit is used when a wire bonding process is performed. Therefore, the wire bonding process for the semiconductor device 10 in FIG. 2 and the wire bonding process for the semiconductor device 40 in FIG. 5 can be performed by using the same wire bonding unit.

FIG. 7 shows a lead frame 50 for use with the semiconductor device 40 when the resin molding process is performed to enclose the semiconductor device 40 in the resin package 13. The lead frame 50 in FIG. 7 is substantially the same as the lead frame 30 in FIG. 4.

The only difference between the semiconductor device 10 in FIG. 2 and the semiconductor device 40 in FIG. 5 is that the wire 17 is joined to the bypass lead portion 18 in the semiconductor device 10 and the wire 17 is joined to the lead 41-5, not the bypass lead portion 18, in the semiconductor device 40.

The wire bonding process for the semiconductor device 40 which is different from the wire bonding process for the semiconductor device 10 only with respect to the wire 17 may be used. The manufacturing processes other than the wire bonding process may be shared by the semiconductor device 10 and the semiconductor device 40

In the embodiment of FIGS. 5, 6 and 7, a lead forming process for the semiconductor device 40 is performed after the resin molding process and the frame removing process have been performed. During the lead forming process, the outer lead portions 41a-1 through 41a-10 are bent downward from the other portions of the leads 41-1 through 41-10 so that the outer lead portions 41a-1 through 41a-10 extend in a downward slanting direction.

Figure 8A:
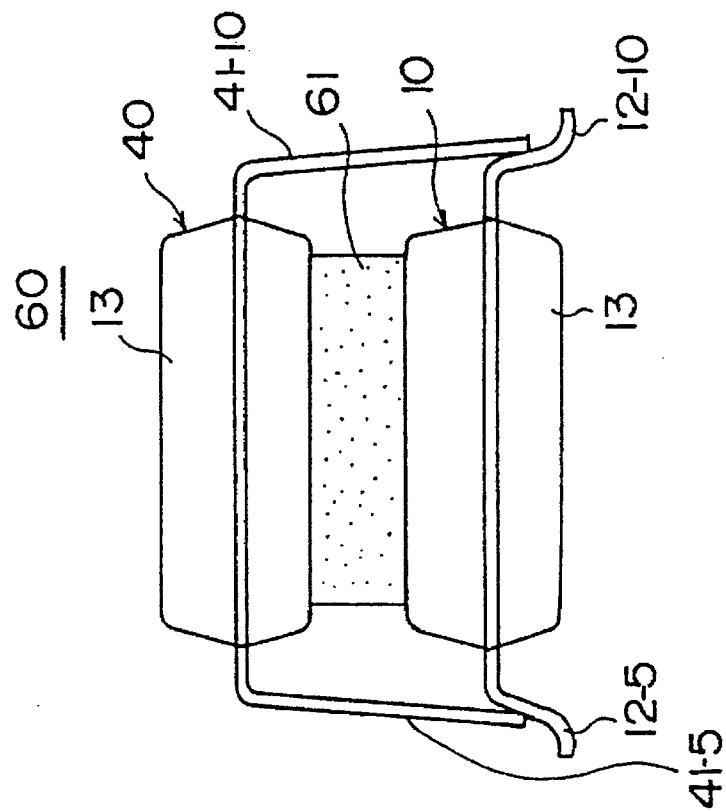
FIGS.8A and 8B are a side view and a front view of a semiconductor device unit in which the semiconductor device in FIG. 5 is stacked over the semiconductor device in FIG. 2.
Figure 8B:
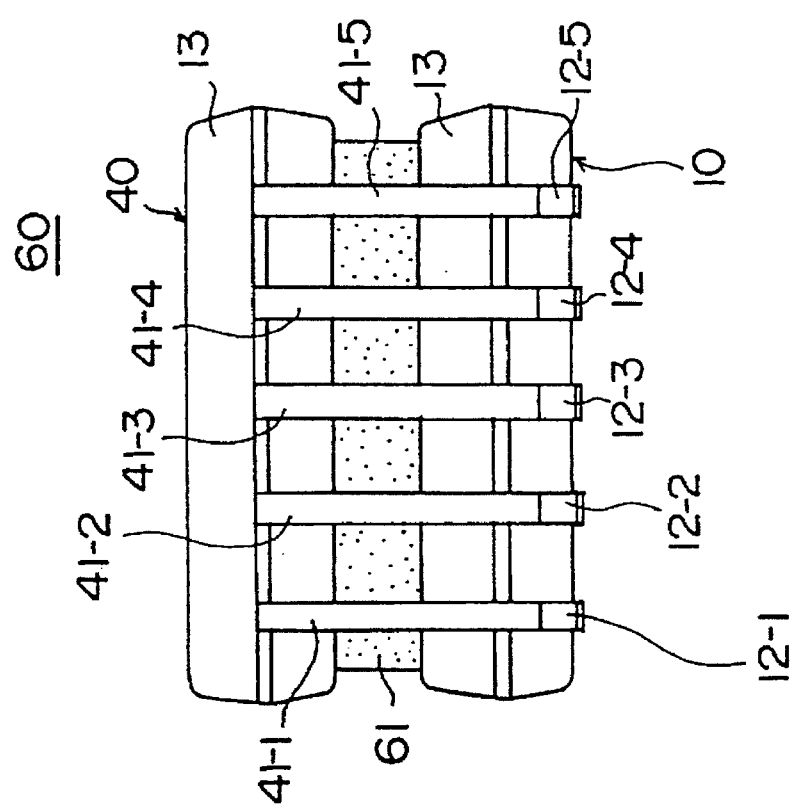

FIGS. 8A and 8B show a semiconductor device unit 60 in which the semiconductor device 40 in FIG. 5 is located over the semiconductor device 10 in FIG. 2. FIG. 8A is a side view of the semiconductor device unit 60, and FIG. 18B is a front view of the semiconductor device unit 60.

Referring to FIGS. 8A and 8B, the bottom of the semiconductor device 40 is secured to the top of the semiconductor device 10 by an adhesive agent 61. The leads 12-1 through 12-10 of the semiconductor device 10 and the leads 41-1 through 41-10 of the semiconductor device 40 are disposed at the corresponding locations.

As described above, in the semiconductor device 40, the outer lead portions 41a-1 through 41a-10 are bent downward from the other portions of the leads 41-1 through 41-10 so that the outer lead portions 41a-1 through 41a-10 extend in a downward slanting direction. In the semiconductor device 10, the outer lead portions 12a-1 through 12a-10 are bent downward from the other portions of the leads 12-1 through 12-10, and the lower edges of the outer lead portions 12a-1 through 12a-10 are further bent to extend in a horizontal direction.

In the semiconductor device unit 60, lower edges of the leads 41-1 through 41-10 are joined to shoulder portions of the leads 12-1 through 12-10 by soldering. Therefore, the leads 41-1 through 41-10 of the semiconductor device 40 and the leads 12-1 through 12-10 of the semiconductor device 10 are electrically connected to each other, respectively.

In the semiconductor device unit 60, the lower edges of the leads 12-1 through 12-10 of the semiconductor device 10 are fitted to a printed circuit board (not shown). A control unit which is capable of supplying a chip-select signal to either the chip-select lead 12-2 of the semiconductor device 10 or the chip-select lead 41-5 of the semiconductor device 40 is provided on the printed circuit board.

In the semiconductor device unit 60, the non-used lead 41-2 of the upper semiconductor device 40 is electrically connected to the chip-select lead 12-2 of the lower semiconductor device 10, and the chip-select lead 41-5 of the upper semiconductor device 40 is electrically connected to the non-used lead 12-5 of the lower semiconductor device 10.

Accordingly, when the chip-select signal from the control unit on the printed circuit board is supplied to the chip-select lead 12-2 of the semiconductor device 10, the chip-select signal on the chip-select lead 12-2 serves to enable the lower semiconductor device 10 only. The chip-select signal on the non-used lead 41-2 does not serve to enable the upper semiconductor device 40.

Similarly, when the chip-select signal from the control unit on the printed circuit board is supplied to the chip-select lead 41-5 of the semiconductor device 40, the chip-select signal on the chip-select lead 41-5 serves to enable the upper semiconductor device 40 only. The chip-select signal on the non-used lead 12-5 does not serve to enable the lower semiconductor device 10.

Therefore, in the semiconductor device unit 60, the chip-select signal can be supplied to one of the two semiconductor devices 10 and 40, and one of the devices 10 and 40 can be selectively enabled according to the chip-select signal on the chip-select electrode on that semiconductor device.

By including the bypass lead portion 18 in each semiconductor device, it is possible to provide a flexibility of wiring of the leads and the electrodes for the semiconductor device. By including the supporting lead 19 in each semiconductor device, it is possible to increase the reliability of the semiconductor device. Accordingly, in the semiconductor device unit 60, the two semiconductor devices 10 and 40 can be easily stacked with the flexibility, and the semiconductor device unit 60 can be made reliable.

In addition, if the semiconductor device unit 60 is fabricated on a printed circuit board in place of a single semiconductor device, the packaging density of the printed circuit board can be increased. Thus, the semiconductor device unit 60 of the present invention serves to provide a small-size electronic system including various semiconductor devices.

Figure 13:
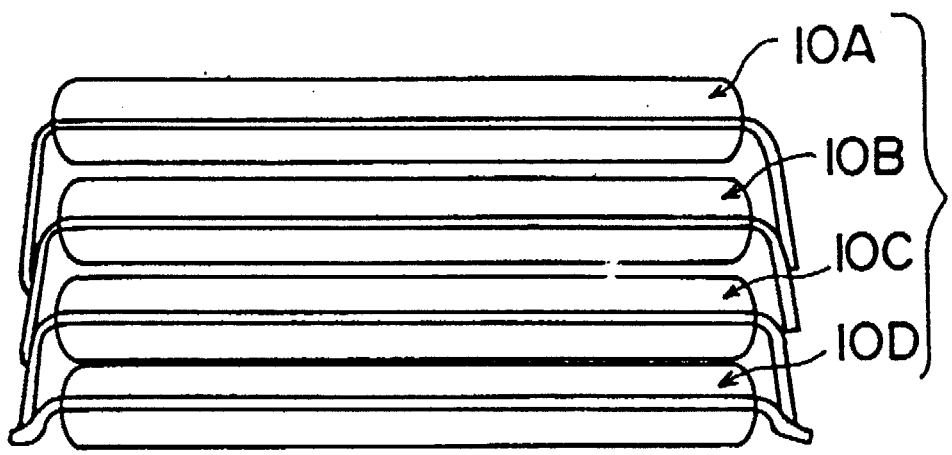
FIG. 13 is a diagram showing a variation of the semiconductor device unit in FIGS.8A and 8B.

In the embodiment of FIGS. 8A and 8B, two semiconductor devices are stacked in the semiconductor device unit 60. However, the number of semiconductor devices included in the semiconductor device unit of the present invention is not limited to two. It is possible to provide a semiconductor device unit in which three or more semiconductor devices are stacked one over another. For example, as shown in FIG. 13, a semiconductor device unit 60A in which four semiconductor devices 10A through 10D are stacked one over another can be provided according to the present invention.

Figure 9:
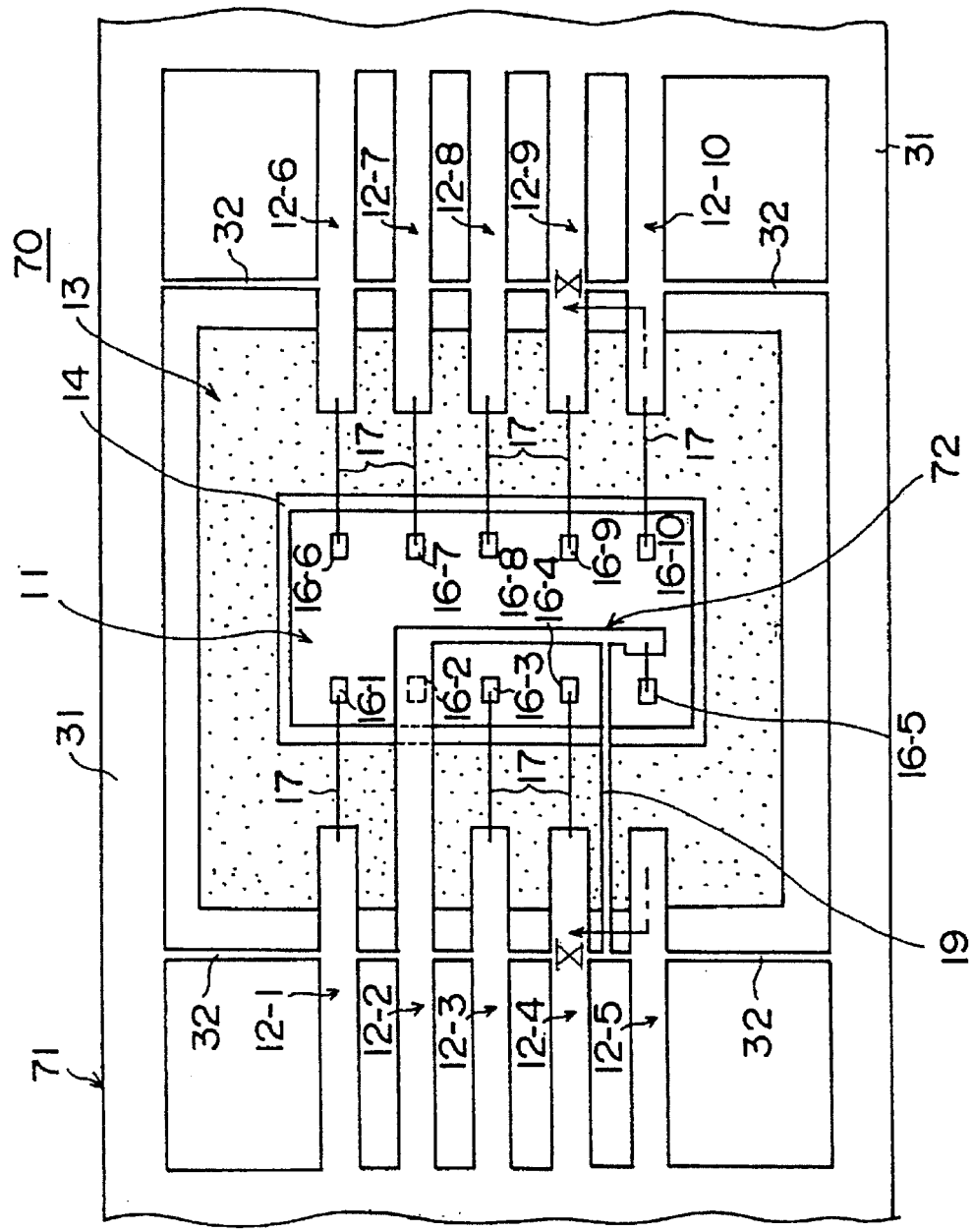
FIG. 9 is a diagram of a modification of the semiconductor devices in FIGS.2 and 5.
Figure 10:
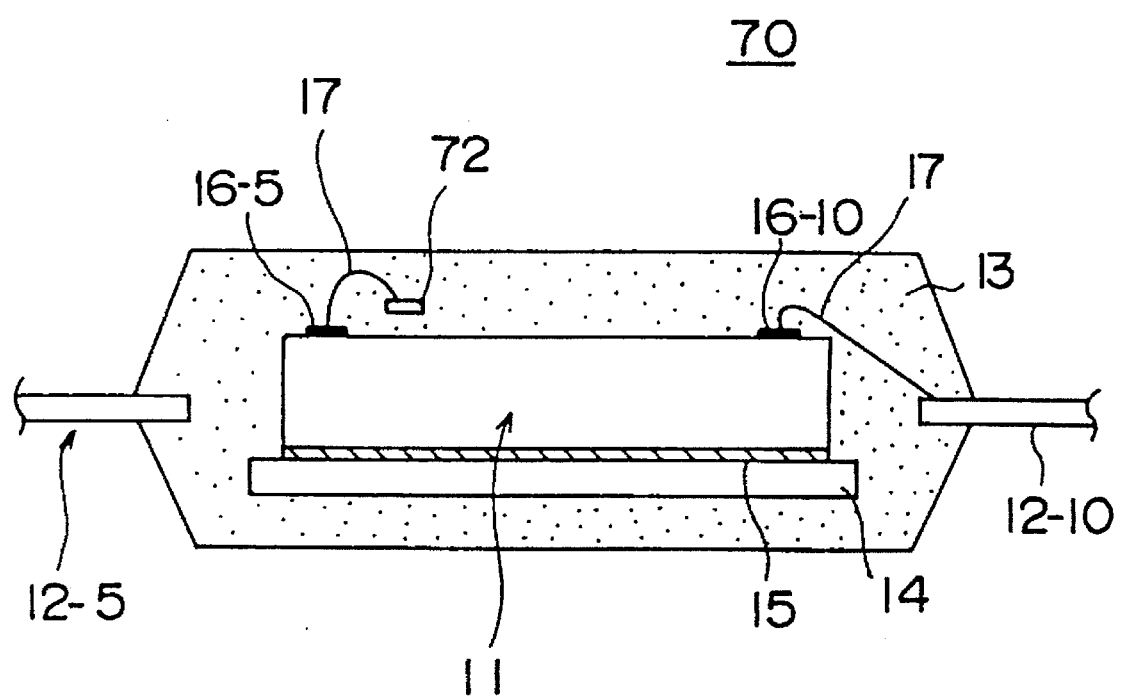
FIG. 10 is a cross-sectional view of the semiconductor device taken along a line X—X in FIG. 9.

FIGS. 9 and 10 show a semiconductor device 70 which is a modification of the above-described semiconductor devices 10 and 40. More specifically, FIG. 9 shows the semiconductor device 70 as well as a lead frame 71 for use with the semiconductor device 70 when the resin molding process is performed. FIG. 10 is a cross-sectional view of the semiconductor device 70 taken along a line X—X indicated in FIG. 9.

In FIGS. 9 and 10, the elements which are the same as corresponding elements in FIGS. 2, 3 and 4 are designated by the same reference numerals, and a description thereof will be omitted.

In the embodiments of FIG. 2 and FIG. 5, the bypass lead portion 18 is disposed on the side of the semiconductor 1hip 11 and located between the leads 12-3 through 12-5 (or the leads 41-3 through 41-5) and the semiconductor chip 11. The forming of the bypass lead portion 18 in this location may be difficult when a semiconductor device having a smaller size is needed. If the width of the bypass lead portion 18 is reduced to a too small width, the impedance of the bypass lead portion 18 may be increased.

Referring to FIGS. 9 and 10, the semiconductor device 70 includes a bypass lead portion 72 which is intended to resolve the above-described problem. The bypass lead portion 72 is disposed above the semiconductor chip 11 such that the bypass lead portion 72 is extended from the inner lead portion of the lead 12-2 and is located over the semiconductor chip 11. Thus, the semiconductor device 70 has a lead-on-chip (LOC) structure.

In the semiconductor device 70, the bypass lead portion 72 is laid over the semiconductor chip 11, and it is not necessary to dispose the bypass lead portion 72 on the side edge of the semiconductor chip 11. Therefore, it is possible to provide the semiconductor device 70 having a smaller size. The bypass lead portion 72 in the semiconductor device 70 can have an increased width, thereby preventing the impedance of the bypass lead portion 72 from being increased.

In the above embodiment of FIGS. 9 and 10, the inner lead portions of the leads 12-1 and 12-3 through 12-5, other than the lead 12-2, are disposed on the side of the semiconductor chip 11. In order to provide a semiconductor device having a smaller size, a further modification of the semiconductor device 70 can be made so that the leads 12-1 and 12-3 through 12-5 as well as the lead 12-2 are further extended and located over the semiconductor chip 11.

Figure 11:
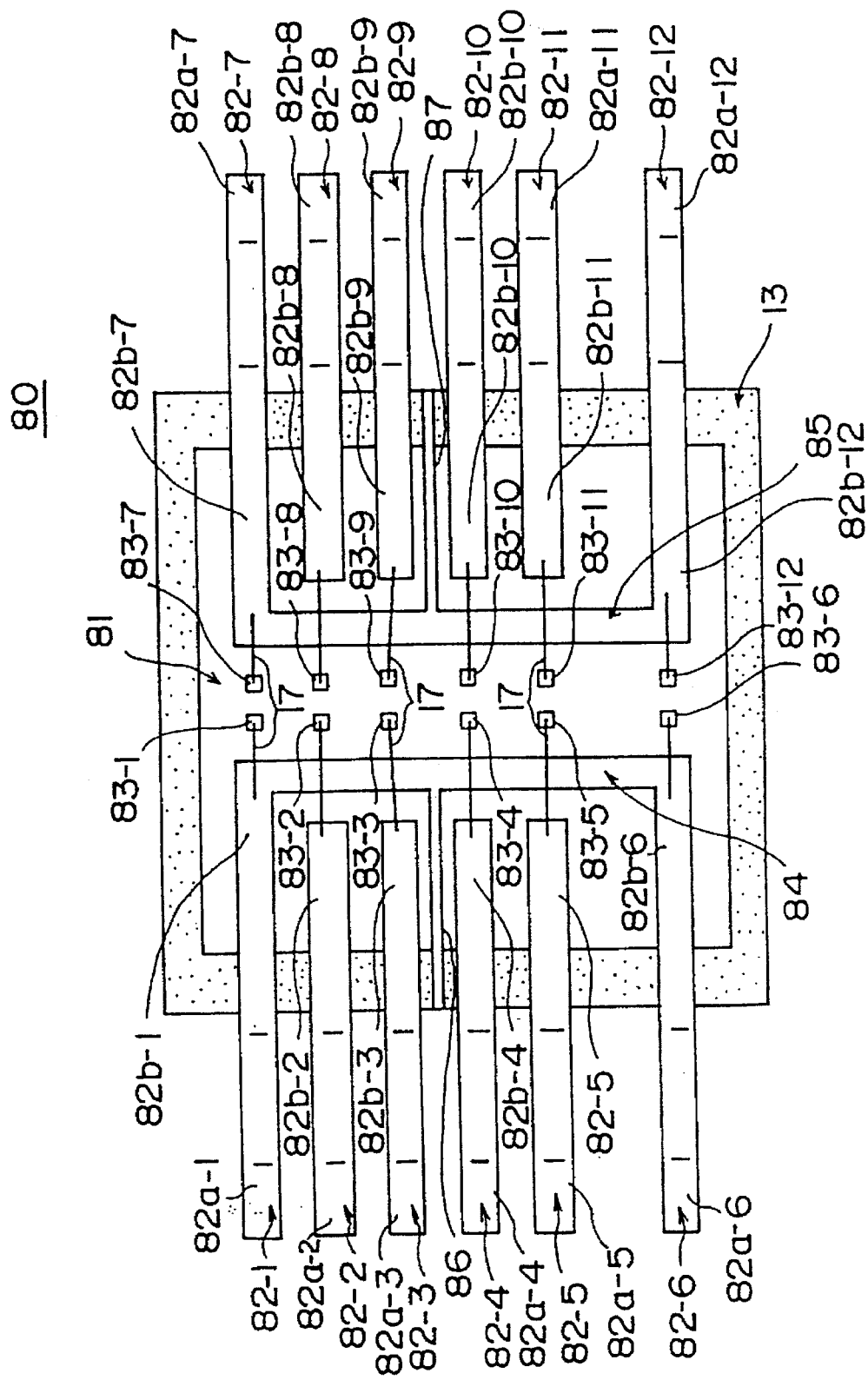
FIG. 11 is a diagram of a semiconductor device in a further embodiment of the present invention.
Figure 12:
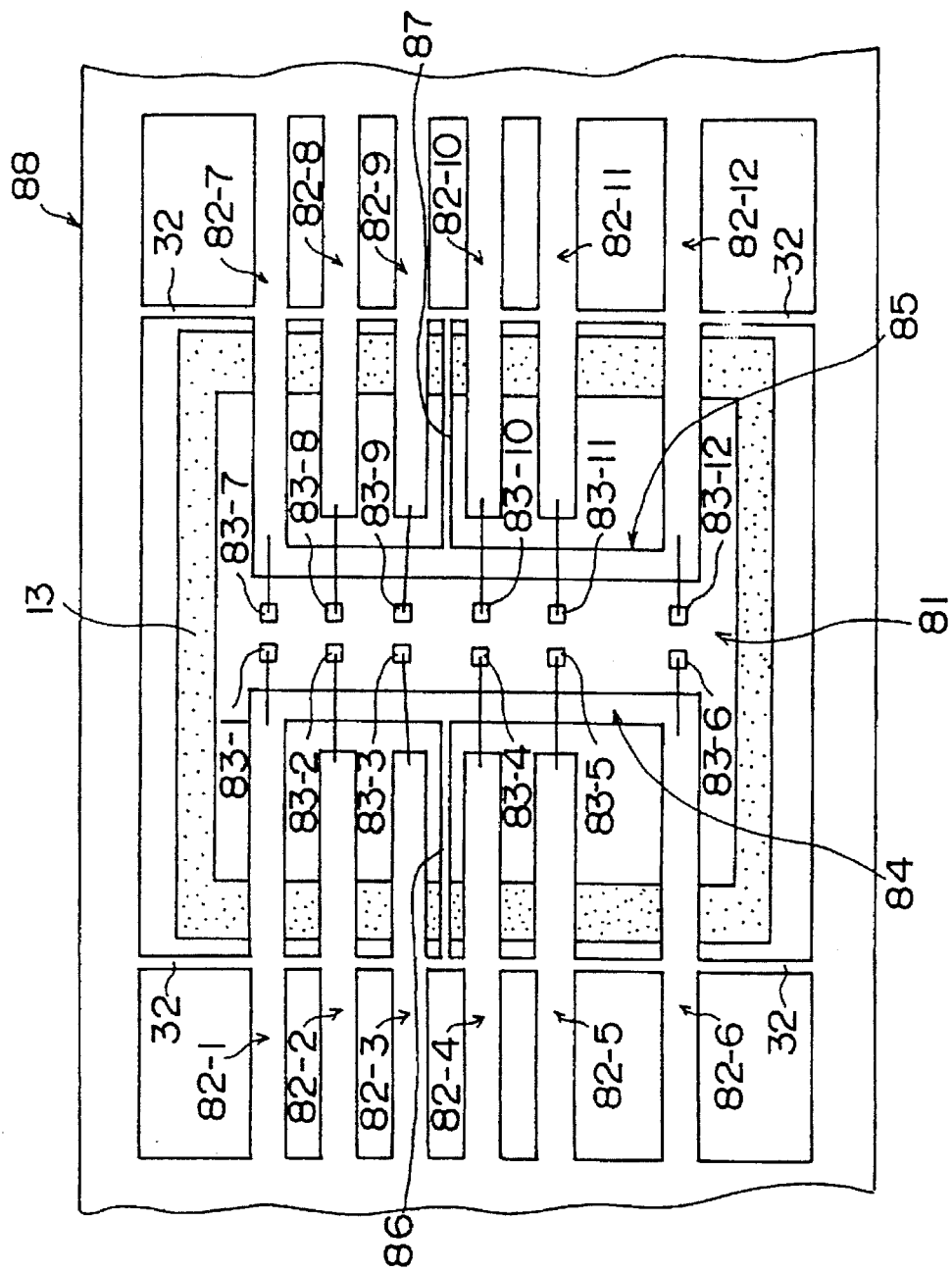
FIG. 12 is a diagram of a lead frame for use with the semiconductor device in FIG. 11.

FIG. 11 shows a semiconductor device 80 in a further embodiment of the present invention. FIG. 12 shows a lead frame 88 for use with the semiconductor device 80 when the resin molding process is performed. In FIGS. 11 and 12, the elements which are the same as corresponding elements in FIGS. 2, 3 and 4 are designated by the same reference numerals, and a description thereof will be omitted.

Referring to FIGS. 11 and 12, the semiconductor device 80 generally has a semiconductor chip 81, a plurality of electrode pads 83-1 through 83-12, a plurality of leads 82-1 through 82-12, and the resin package 13. The electrode pads 83-1 through 83-12 are provided in two rows on the semiconductor chip 81 in the middle of the semiconductor chip 81.

The leads 82-1 through 82-12 have respective outer lead portions 82a-1 through 82a-12 and respective inner lead portions 82b-1 through 82b-12. The outer lead portions 82a-1 through 82a-12 serve as external terminals of the semiconductor chip 81. The inner lead portions 82b-1 through 82b-12 are extended over the semiconductor chip 81. Thus, the semiconductor device 80 has a lead-on-chip (LOC) structure.

The inner lead portions 82b-1 through 82b-12 of the leads 82-1 through 82-12 are electrically connected to the electrode pads 83-1 through 83-12 by the wires 17.

The semiconductor device 80, as shown in FIGS. 11 and 12, includes a transversely extending bus bar 84 which interconnects two of the leads 82-1 through 82-6 and includes a transversely extending bus bar 85 which interconnects two of the leads 82-7 through 82-12. More specifically, the leads 82-1 and 82-6 at outermost locations of the leads 82-1 through 82-6 are interconnected by the bus bar 84, and the two leads 82-7 and 82-12 at outermost locations of the leads 82-7 through 82-12 are interconnected by the bus bar 85.

As shown in FIGS. 11 and 12, the bus bar 84 is integrally formed with the leads 82-1 and 82-6, and the bus bar 85 is integrally formed with the leads 82-7 and 82-12. The bus bars 84 and 85 have a width which is the same as a width of the leads 82-1 through 82-12.

In the above embodiment of FIGS. 11 and 12, of the electrode pads 83-1 through 83-12 on the semiconductor chip 81, the electrode pads 83-1 and 83-6 are the power-supplying electrodes, and the electrode pads 83-7 and 83-12 are the grounding electrodes. The electrode pads 83-1 and 83-6 which are the same kind of electrodes are electrically connected to the bus bar 84 by the wires 17, and the electrode pads 83-7 and 83-12 which are the same kind of electrodes are electrically connected to the bus bar 85 by the wires 17. Thus, each of the bus bars 84 and 85 interconnects two of the leads 82-1 through 82-12 and is electrically connected to a predetermined electrode among the electrode pads 83-1 through 83-12.

In the embodiment of FIGS. 11 and 12, a bypass lead portion which electrically connects one of a plurality of leads, not adjacent to a predetermined electrode, to a location adjacent to the predetermined electrode is formed by one of the bus bars 84 and 85.

In the embodiment of FIGS. 11 and 12, the bus bars 84 and 85 are disposed in parallel to the rows of the electrode pads 83-1 through 83-12, and each of the bus bars 84 and 85 is electrically connected to a predetermined electrode among the electrode pads 83-1 through 83-12. It is possible to provide a flexibility of wiring of the leads and the electrodes for the semiconductor device 80. Also, in a case of a semiconductor device including many electrodes which are the same kind, it is possible to reduce the number of the leads, which serves to provide a semiconductor device having a smaller size.

However, in the embodiment of FIGS. 11 and 12, it is necessary that the bus bars 84 and 85 are long enough to interconnect two leads of a plurality of leads at the outermost locations thereof. Thus, the bus bars 84 and 85 are likely to be deformed by the resin material of the resin package 13 during the resin molding process, and the deformed bus bars 84 and 85 are likely to interfere with the other leads 82-2 through 82-5 and 82-8 through 82-11.

As shown in FIGS. 11 and 12, the semiconductor device 80 includes a supporting lead 86 which supports the bus bar 84 and a supporting lead 87 which supports the bus bar 85. The semiconductor device 80 is produced by using the lead frame 88. The lead frame 88 has substantially the same structure as the lead frame 30 in FIG. 4.

The lead frame 88 includes the supporting lead 86 which is disposed between the leads 82-3 and 82-4 to interconnect the tie bar 32 and the bus bar 84, and the supporting lead 87 which is disposed between the leads 82-9 and 82-10 to interconnect the tie bar 32 and the bus bar 85.

Since the bus bars 84 and 85 are supported by the supporting leads 86 and 87, the mechanical strength of the bus bars 84 and 85 can be increased by the supporting leads 86 and 87, and the deformation of the bus bars 84 and 85 during the resin molding process can be prevented by the supporting leads 86 and 87.

Since the supporting leads 86 and 87 are attached to the tie bars 32 of the lead frame 88, the supporting leads 86 and 87 can be easily formed in the lead frame 88.

In the previous embodiments of FIG. 2 and FIG. 5, the bypass lead portion 18 is included in the semiconductor device to connect the chip-select lead 12-2 (or the chip-select lead 41-2) to a location adjacent to the chip-select electrode 16-5. However, the bypass lead portion, included in the semiconductor device of the present invention, is not limited to these embodiments. A bypass lead portion which electrically connects one of a plurality of leads, not adjacent to a predetermined electrode (which is any electrode other than the chip-select electrode), to a location adjacent to the predetermined electrode may be included in the semiconductor device of the present invention.

Further, the present invention is not limited to the above-described embodiments, and variations and modifications may be made without departing from the scope of the present invention.

What is claimed is:

1. A semiconductor device comprising:

a semiconductor chip having electrode pads on the semiconductor chip, said electrode pads including a predetermined electrode;

a plurality of leads having inner lead portions and outer lead portions, said inner lead portions electrically connected to the electrode pads, and said outer lead portions serving as external terminals of said semiconductor chip, said leads including a predetermined lead electrically connected to said predetermined electrode;

a resin package which encloses the semiconductor chip and partially encloses the leads;

a bypass lead portion which electrically connects one of the leads, not adjacent to the predetermined electrode, to a location adjacent to the predetermined electrode, said bypass lead portion being enclosed in said resin package; and at least one supporting lead which supports said bypass lead portion such that said supporting lead prevents a deformation of said bypass lead portion, said supporting lead being enclosed in the resin package.

2. The semiconductor device according to claim 1, wherein said bypass lead portion is disposed on a side of the semiconductor chip to extend from the inner lead portion of said one of the leads to the location adjacent to the predetermined electrode.

3. The semiconductor device according to claim 1, wherein said bypass lead portion is located above the semiconductor chip such that the bypass lead portion is extended from the inner lead portion of said one of the leads and located over the semiconductor chip.

4. The semiconductor device according to claim 1, wherein said bypass lead portion is formed by a bus bar which interconnects two of the leads and is electrically connected to the predetermined electrode, said two of the leads located at outermost locations of the leads.

5. The semiconductor device according to claim 1, wherein said predetermined electrode is a chip-select electrode of the semiconductor chip.

6. The semiconductor device according to claim 1, wherein said predetermined lead is a chip-select lead selected from among the leads of the semiconductor device.

7. The semiconductor device according to claim 1, wherein said bypass lead portion electrically connects a chip-select lead of the semiconductor device to an end of the bypass lead portion adjacent to a chip-select electrode of the semiconductor chip, and said end of the bypass lead portion is electrically connected to said chip-select electrode.

8. The semiconductor device according to claim 1, wherein said bypass lead portion electrically connects one of the leads, different from a chip-select lead of the semiconductor device, to an end of the bypass lead portion adjacent to a chip-select electrode of the semiconductor chip, and said end of said bypass lead portion is not electrically connected to said chip-select lead, and said chip-select lead is electrically connected to said chip-select electrode.

9. A semiconductor device unit in which a first semiconductor device is stacked over a second semiconductor device, each of said first semiconductor device and said second semiconductor device comprising:

a semiconductor chip having electrode pads on the semiconductor chip, said electrode pads including a predetermined electrode;

a plurality of leads having inner lead portions and outer lead portions, said inner lead portions electrically connected to the electrode pads, and said outer lead portions serving as external terminals of said semiconductor chip, said leads including a predetermined lead electrically connected to said predetermined electrode;

a resin package which encloses the semiconductor chip and partially encloses the leads;

a bypass lead portion which electrically connects one of said leads, not adjacent to the predetermined electrode, to a location adjacent to the predetermined electrode, said bypass lead portion being enclosed in said resin package; and at least one supporting lead which supports said bypass lead portion such that said supporting lead prevents a deformation of said bypass lead portion, said supporting lead being enclosed in the resin package, wherein the outer lead portions of the first semiconductor device are electrically connected to the outer lead portions of the second semiconductor device.

* * * * *